United States Patent [19]

Horng et al.

[11] 4,301,588

[45] Nov. 24, 1981

[54] CONSUMABLE AMORPHOUS OR POLYSILICON EMITTER PROCESS

[75] Inventors: Cheng T. Horng, San Jose, Calif.; Alwin E. Michel, Ossining, N.Y.

[73] Assignee: International Business Machines Corporation, Armonk, N.Y.

[21] Appl. No.: 117,887

[22] Filed: Feb. 1, 1980

[51] Int. Cl.$^3$ .......................................... H01L 21/205
[52] U.S. Cl. ....................................... 29/276; 29/278; 148/1.5
[58] Field of Search ................. 148/1.5; 29/276 B, 278

[56] References Cited

U.S. PATENT DOCUMENTS

| | | | |
|---|---|---|---|
| 3,558,366 | 1/1971 | Lepselter | 148/1.5 |
| 3,777,364 | 12/1973 | Schinella et al. | 29/578 |
| 4,011,105 | 3/1977 | Paivinen et al. | 148/1.5 |
| 4,063,967 | 12/1977 | Graul et al. | 29/578 |
| 4,074,300 | 2/1978 | Sakai et al. | 357/23 |
| 4,109,372 | 8/1978 | Geffken | 29/578 |
| 4,151,006 | 4/1979 | DeGraaff et al. | 148/1.5 |
| 4,190,466 | 2/1980 | Bhattacharyya et al. | 29/578 |
| 4,216,030 | 8/1980 | Graul et al. | 148/1.5 |
| 4,242,791 | 1/1981 | Horng et al. | 29/578 |

*Primary Examiner*—Donald L. Walton
*Attorney, Agent, or Firm*—Wesley DeBruin

[57] ABSTRACT

The process employs ion implantation for precise dopant control. The implantation is performed into a thin layer of amorphous silicon covering the emitter and collector opening. The implantation energy is chosen so that the damage is confined to the amorphous layer. Since the deposited silicon layer is to be removed by subsequent processing, its thickness must be carefully controlled. The layer is preferably deposited by a sputtering technique which allows the necessary uniformity and reproducibility of the layer thickness. Furthermore, the sputtering process with its energetic ions provides a reproducible quality interface which is of critical importance for a diffusion source. With such a source, the diffusion into the single crystal silicon extends about the same distance in the horizontal as the vertical direction. This provides the greatest possible horizontal displacement of the junction under the passivating silicon dioxide layer. The depths of the n-type region is thinned to the single crystal surface by consuming the polysilicon partly through oxidation and partly through conversion to platinum silicide. The platinum silicide silicon interface provides a high surface recombination velocity in order to deplete the density of holes injected into the emitter. The low hole density in the emitter region has a direct benefit of decreasing the switching delay due to hole storage in the emitter, and hence higher device performance.

1 Claim, 16 Drawing Figures

CONSUMABLE AMORPHOUS OR POLYSILICON EMITTER PROCESS

BACKGROUND OF THE INVENTION

This invention relates to monolithic integrated circuit devices, their structure, and preparation, and particularly to the fabrication of the emitter region of very shallow devices.

The progress in solid state technology is largely determined by the ability to control and modify material parameters in a well defined manner. Semiconductors are a typical example, where minute traces of impurities will markedly influence the electrical properties. The concept of introducing dopants into semiconductors by means of high energetic particles is well known. This introduction of particles is commonly referred to as ion implantation which is defined as a process in which a beam of energetic particles is directed against a body of materials to selectively affect electrical and/or chemical changes in the body by the causing of the ions, of the beam, to pass into the body of the treated material.

Ion implantation of impurities into semiconductor substrates has a number of significant advantages in the fabrication of semiconductor devices over the more conventional introduction by thermal diffusion. Since ion implantation is not a high temperature process, a larger number of materials, including organic photoresists, can be used as masking for controlling the area of implantation into the substrate. Also, multiple impurity introduction operations can be achieved without resort to high temperatures. Exposure to high temperatures, as in thermal diffusion, disperses the impurities previously introduced. Ion implantation techniques permit greater control of the placement and depth of penetration into the semiconductor. In general, the total amounts of impurities introduced and the depths of penetration can be more closely controlled by ion implantation techniques than with thermal diffusion from conventional sources.

Consequently, integrated circuit devices can be made smaller, with greater precision, with better control of heating, and with higher operating speeds using ion implantation technology. As improvements in lithography permit smaller horizontal geometries the vertical dimensions of the semiconductor devices must also be compressed in order to achieve the highest performance. As the emitter junction become very shallow (e.g. <200 $\eta$m) one experiences problems with junction passivation.

One facet of the ion implantation process is that the ions are implanted a finite distance into the silicon. Although there is also some lateral scattering under the mask edge, this is much smaller than the vertical penetration. Hence the vertical junction depth will always be greater than the horizontal displacement under the mask edge. Clearly the ratio of horizontal to vertical displacement becomes smaller as the junction becomes shallower, at least for the same implant conditions. Too small of a lateral extent of the emitter under the insulator results in a poorly passivated or shorted emitter-base junction.

This problem is even more serious for devices fabricated with dual dielectric surface insulators. A conventional technology employs a layer of $Si_3N_4$ on top of a layer of $SiO_2$ for the purposes of passivation and self alignment. In this case, the opening in the top insulating layer serves as an etch mask for the lower $SiO_2$ layer. In order to guarantee that the contact is open to the silicon some over etching is necessary. Since the emitter dopant is supplied by a low energy (20 to 50 Kev.) arsenic implant, the upper insulator (usually $Si_3N_4$) will mask the ions from the undercut region. During the drive in of the emitter a small amount of oxide must be grown (150–200 Å) in order to prevent outdiffusion of the arsenic. This oxide must be removed which causes additional undercutting. If this accumulated undercutting is too severe compared with the lateral motion of the junction, then the junction will be poorly passivated or shorted. The shallower the emitter junction, the smaller the lateral motion of the dopant, and hence the tolerance to undercutting becomes more critical.

Also, the conventional methods of contacting the emitter region enhance the difficulty of passivating very shallow structures. To assure good electrical contact, it is essential to use a silicide contact layers such as, PtSi or $Pd_2Si$. These are formed by interacting the precious metal with the silicon. Thus, the boundary between the silicide and the silicon is even closer to the perimeter of the emitter base junction.

Still another problem is encountered in fabricating very shallow structures with conventional ion implantation techniques and that has to do with the damage to the crystal lattice caused by the implanted ions. The shallow structure requires a very small amount of thermal treatment to drive the dopant into the proper depth. This thermal treatment also must serve to anneal the implantation damage and it is insufficient for very shallow emitters. It is acknowledged that platinum silicide as a contact and/or interconnection to a silicon region in an integrated circuit device is well known in the art. See for example, U.S. Pat. No. 3,777,364, entitled "Methods For Forming Metal/Metal Silicide Semiconductor Device Interconnect System" granted Dec. 11, 1973 to R. D. Schinella et al.

SUMMARY OF THE INVENTION

It is the object of this invention to provide a unique process for the fabrication of an integrated circuit semiconductor device with a very shallow emitter region. This process produces high yield well passivated emitter base junctions with junction depths of the order of 100 $\eta$m.

The process employs ion implantation for precise dopant control. A thin ($\sim$50 $\eta$m) sputtered amorphous silicon layer forms a buffer region in which to implant the emitter dopant. The ion implantation damage, of course, is also confined to this thin layer. The sputtering process provides a conformal coating which fills any undercut region. The diffusion coeficient of the implanted impurities in the sputtered layer is very high and hence they spread out to give a uniform diffusion source over the emitter opening. With such a source, the diffusion into the single crystal silicon extends about the same distance in the horizontal as the vertical direction. This provides the greatest possible horizontal displacement of the junction under the passivating silicon dioxide layer. Since the silicon layer must be very thin ($\sim$50 $\eta$m) and is to be consumed in subsequent processing, the thickness must be carefully controlled. The sputtering process is capable of giving a high degree of uniformity and reproducibility of layer thickness.

Another requirement for the layer to be a good diffusion source is that there be intimate contact to the single crystal silicon. For example, a thin oxide layer will impede, or if thick enough, block the impurity atoms from reaching the single crystal silicon. The sputtering process with its energetic ions tends to disrupt the surface and provide a more intimate contact. If necessary, the surface can be cleaned, in situ, by a reverse sputtering or ion milling technique.

A possible alternative to the thin sputtered amorphous layer is a chemical vapor deposited (CVD) polysilicon layer. This does not provide the advantages of thickness control or interface quality of the sputtering process. If CVD is to be used, the energy of the implanted ions should be adjusted to damage the interfacial region in order to give a more uniform diffusion source. This, of course, does not permit the damage to be confined to the deposited layer, but, it may be suitable for somewhat deeper structures where the thermal cycle is sufficient to anneal the damage.

One of the reasons to go to very shallow emitter structures is to reduce the minority carrier (holes in the case of an n-p-n transistor) storage and thus, improve the transient response. In shallow emitters, where the minority carrier diffusion length is greater than the emitter depth, the minority charge storage is proportional to the emitter thickness. In order to achieve the best response, the amorphous silicon layer must be removed since it effectively adds to the emitter thickness. The amorphous layer is consumed in two steps. The first is an oxidation step which consumes about half of the thickness, $\sim 25$ κm, and also provides part or possibly all of the thermal drive-in to form the emitter region in the single crystal silicon. The oxide is removed by etching in a hydroflouric acid solution. The remainder of the amorphous silicon is consumed by the formation of the PtSi contact.

DESCRIPTION OF THE PREFERRED EMBODIMENTS

Figure 1:
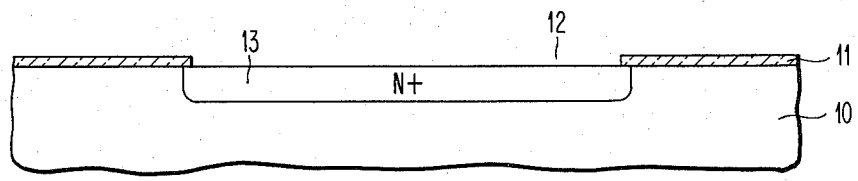
FIGS. 1 through 13 and 14 through 16 depict the structure at successive stages in the process in accordance with the invention.

Referring now to the figures of the drawings, and FIG. 1 in particular, a monocrystalline silicon wafer 10 is oxidized forming a masking layer 11. A diffusion window 12 for forming the subcollector is made in the layer 11 using standard photolithographic and substrative etching techniques. An N-type impurity is then introduced into wafer 10 forming the subcollector region 13. The impurity can be any suitable N-type impurity, as for example arsenic, and can be introduced into wafer by any suitable technique as for example, capsule diffusion or ion implantation.

Figure 2:
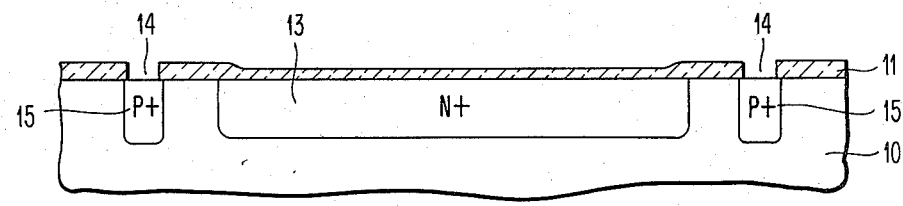

As shown in FIG. 2 the surface is re-oxidized reforming the masking layer over the subcollector 13. Diffusion windows 14 are made for the annular subisolation region by standard photolithographic and subtractive etching techniques and a P-type impurity introduced to form the sub-isolation region 15. The impurity preferably is boron introduced by capsule diffusion or BBr3 diffusion.

Figure 3:
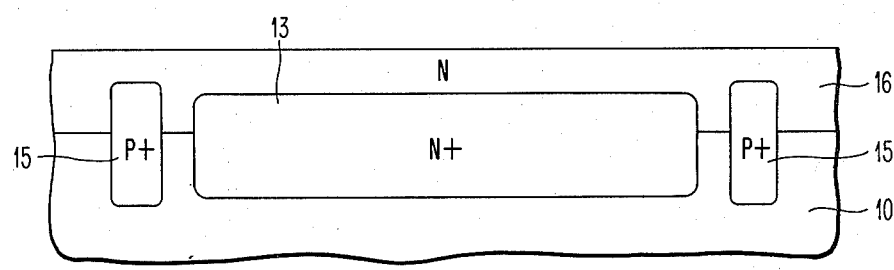

As shown in FIG. 3 the masking layer 11 is removed and an epitaxial silicon layer 16 deposited on the surface of wafer 10. During the epitaxial deposition process, which is a high temperature process, the subcollector region 13 and the subisolation region 15 diffuses upwardly into the layer 16.

Figure 4:
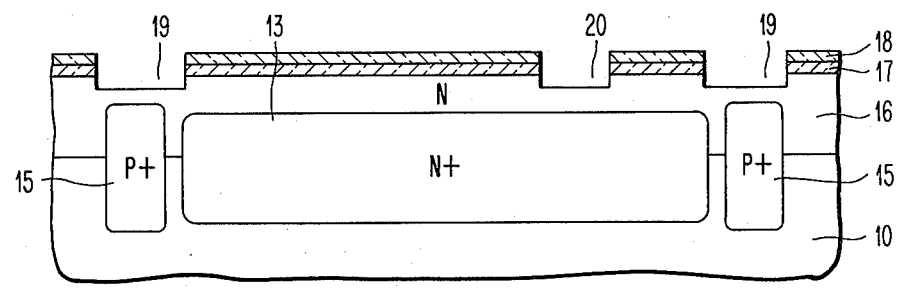

As shown in FIG. 4, the surface of the epitaxial layer 16 is oxidized in a suitable oxidizing atmosphere, as for example, steam at 950° C., forming thermal oxide layer 17. A layer 18 of $Si_3N_4$ is subsequently deposited over layer 17 by conventional chemical vapor deposition (CVD) techniques that are well known in the industry. $Si_3N_4$ layer 18 will serve as a mask to prevent oxidation of the underlying regions of the epitaxial layer during formation of the recessed oxidation isolation region which will be described hereafter. A layer of photoresist, not shown, is then deposited over the layer of CVD $Si_3N_4$. The resist is then exposed, developed to form windows which overlie the sub-isolation region 15. A second opening is also made which will result in an oxide region which separates the base region from the collector reach through region. Using photoresist as an etch mask, the exposed areas of the underlying $Si_3N_4$ and $SiO_2$ layers are removed by reactive ion etching technique resulting in openings 19 which overlie the sub-isolation region 15 and opening 20 which overlies the region which will separate the collector reach through region from the base region of the transistor device. Subsequently, a portion of the epitaxial layer 16, that is exposed through windows 19 and 20 is removed by subtractive etching or reactive ion etching to a depth approximately ½ the depth that the recessed oxide region will extend into the epitaxial layer.

Figure 5:
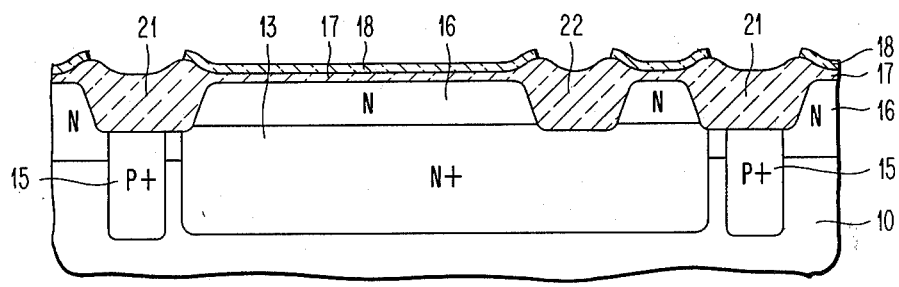

As shown in FIG. 5, the device is then exposed to an oxidizing atmosphere which results in the formation of the recessed oxide regions 21 on top of the sub-isolation region 15 and region 22 separating the collector reach through region from the base region. The oxidizing atmosphere is typically steam heated at 1000° C.

Figure 6:
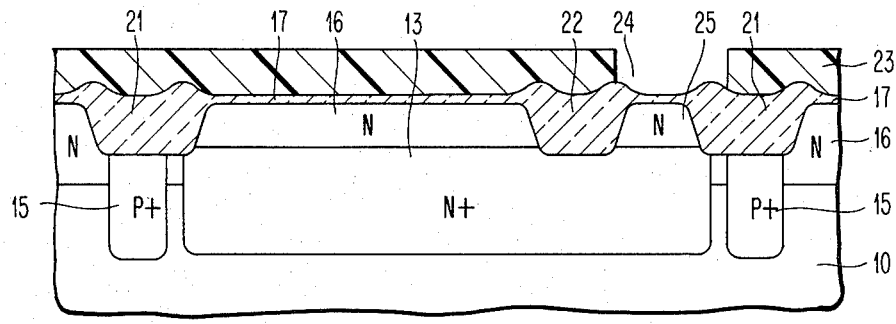

As shown in FIG. 6, the $Si_3N_4$ layer 18 is removed and a layer of photoresist 23 deposited on the surface of the device. The resist layer 23 is exposed and developed to form an opening 24 which overlies the collector reach through region. A suitable N-type impurity, preferably phosphorus, is implanted into the epitaxial layer 16 to form collector reach through 25. Preferably phosphorus implantation is done at a high energy, as for example, 400 KeV, so as to make good reach through to the underlying subcollector 13. Resist layer 23 is then removed by using $O_2$ plasma.

Figure 7:
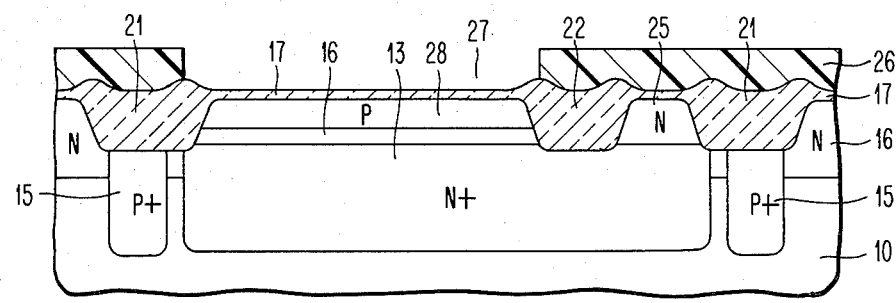

As shown in FIG. 7, a photoresist layer 26 is photolithographically patterned to expose the base area 27. A suitable P-type impurity, preferably boron, is implanted into the epitaxial layer 16 to form the base region 28. The implant energy and dose depend upon the thickness of the oxide layer and the desired vertical device geometry. For example, an implantation of $10^{14}$ boron atoms at 50 KeV and a thickness of 1000 Å of the oxide layer 17 is used to produce a base collector junction about 400 ηm deep in a 0.3 ohm cm epi layer. The resist layer 26 is removed by an $O_2$ plasma.

Figure 8:
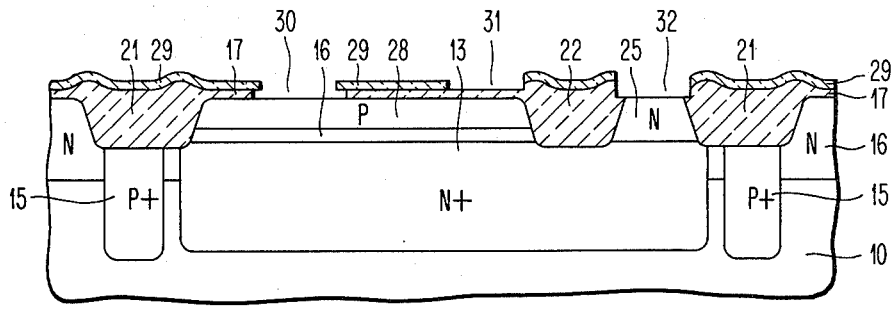

As indicated in FIG. 8, a layer of $Si_3N_4$ 29 is deposited over the oxide layer 17. A layer of photoresist, not shown in the figure, is deposited over layer 29. The photoresist layer is exposed and developed to produce a window 30 for the emitter contact, a window 31 for the base contact, and a window 32 for the collector contact.

The silicon nitride layer 29 is removed in all of the device contact regions 30, 31 and 32. A photolithographic step is applied to form a block out mask to prevent etching of the oxide 17 in the base contact 31 while the oxide is etched from the emitter 30 and collector 32 contact regions. It is this step which can cause undercutting of the oxide layer 17 at the edges of the emitter and collector contact openings 30 and 32.

Figure 9:
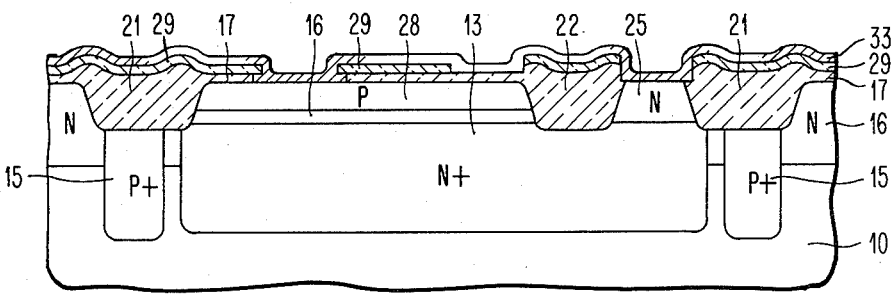

In FIG. 9 an amorphous silicon 33 layer is deposited. In order to fill the undercut region the deposition should be conformal. The technique must also provide good thickness uniformity and reproducibility. These capabilities have been demonstrated by the sputtering methods. The thickness of the deposited silicon layer depends upon the desired vertical device dimensions, but, is typically in the 50 to 100 $\eta$m range.

Doping of the amorphous silicon layer is then accomplished by a blanket ion implantation of arsenic. The energy and dose of the implanted arsenic ions is adjusted to confine the dopant to the deposited silicon layer. For example, with a 500 Å layer thickness an energy of 30 to 40 KeV with dose of $2 \times 10^{15}$ atoms/cm$^2$ for a final emitter depth of 100 $\eta$m.

Figure 10:
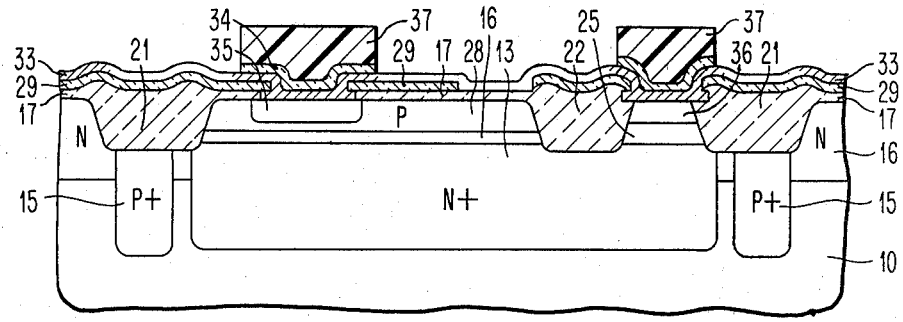

In FIG. 10 the arsenic implanted amorphous silicon layer is oxidized 34 in order to consume approximately one-half of the layer thickness. For very shallow emitters it is desired to minimize the arsenic diffusion during this step. Hence, it should be accomplished at a low temperature, for example, 900° C. In this regard it is desirable to use a low energy for the arsenic implantation, as the surface region will have a higher concentration and thus an enhanced rate of oxidation. The oxidation step also provides an unpermeable cap which prevents the escape of the arsenic dopant from the amorphous silicon layer. Since the segregation coefficient favors the silicon side of the oxide interface, the arsenic impurities pile up in front of the advancing oxide silicon interface. This is important since it further enhances the oxidation rate but keeps virtually all of the implanted arsenic confined to the silicon. This gives a very reproducible source for the next step which is to drive the arsenic into final position in the single crystal silicon to form the emitter region 35. The arsenic is also driven into the collector contact 32 to form a low resistivity region 36 for good ohmic contact. The emitter drive-in cycle depends upon the desired structure as well as the amount of diffusion achieved during the oxidation cycle. For the above suggested implant conditions of $2 \times 10^{15}$ at 40 Kev with a polysilicon thickness of 50 $\eta$m, and an oxidation cycle of 60 minutes at 900° C., which grows about 45 $\eta$m of SiO$_2$, a drive-in at 950° C. for 30 minutes in N$_2$ produces a junction that is about 100 $\eta$m into the silicon single crystal.

After the drive-in a photo resist layer 37 is photolithographically defined to cover the emitter and collector regions. This is used as an etch mask to remove the oxide layer 34 on top of the polysilicon.

Figure 11:
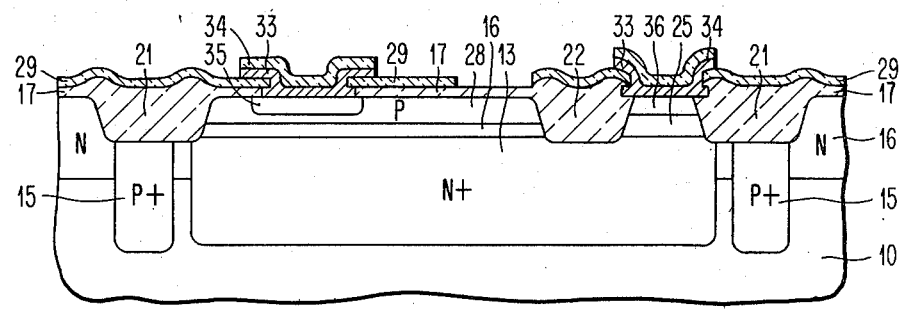

As shown in FIG. 11, the photoresist is removed and the oxide 34 remaining over the emitter and collector contacts is used as a mask to etch the amorphous silicon 33. The amorphous silicon etching can be accomplished by reactive ion or wet chemical etching.

Figure 12:
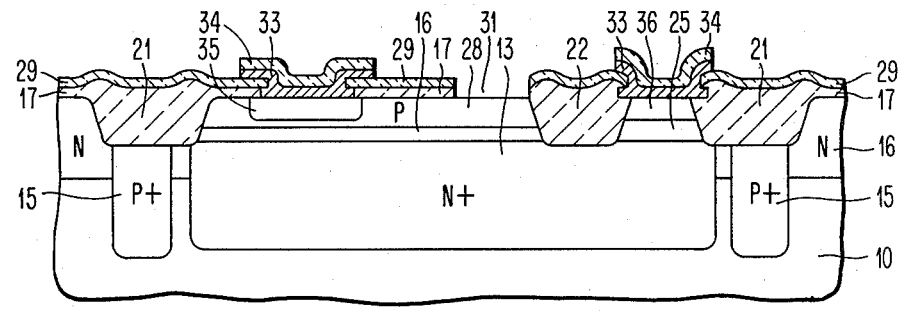

In FIG. 12 the oxide layer 17 over the base contact 31 is removed with a buffered HF solution. This etch step also removes the oxide 34 on top of the remaining amorphous silicon 33 over the emitter and collector contact.

Figure 13:
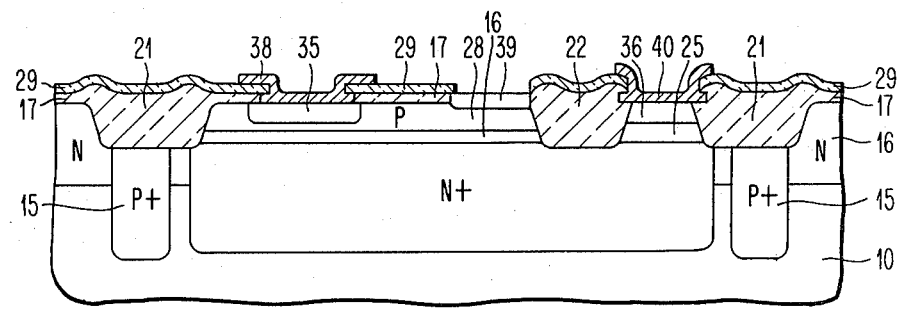

In FIG. 13 a layer of Pt is deposited on the wafer. The thickness of the Pt film is made to be approximately the same as the remaining amorphous silicon. The wafer is then heated to about 500° C. in forming gas for about 30 minutes to react the platinum with the underlaying silicon to form PtSi. The unreacted Pt on top of the dielectric areas is then removed in an aqua regia solution leaving the PtSi contacts 38, 39 and 40 to the emitter, base, and collector of the transistor.

The device illustrated in FIG. 13 is now ready for the deposition and fabricating of the metallurgy system which will interconnect the device shown with other devices, resistors, and the like on the same substrate 10 into electrical circuits. The forming of the metallurgy system is well known in the art and will not be discussed or described. It will be understood that the preferred embodiment illustrated and described in FIGS. 1 through 13 is an NPN device. It is understood that the conductivity types could be reversed, the impurities changed and other modifications made without departing from the spirit and scope of the invention.

For fabrication of transistors with ultra small horizontal dimensions, it is desirable to have a self aligned process. Thus, in the preferred implementation described above the mask alignment required to delineate the polysilicon over the emitter and collector contact would be unacceptable. To circumvent this condition, the following implementation is offered.

Figure 14:
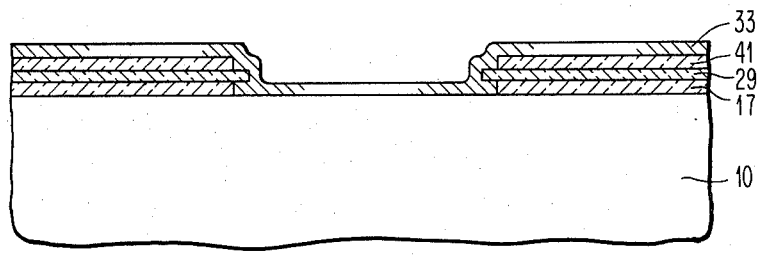

In FIG. 14, which depicts only the emitter or collector contact region, a layer of CVD SiO$_2$ 41 is deposited on the silicon nitride. The contact openings are formed and the amorphous silicon 33 deposited as previously described.

Figure 15:
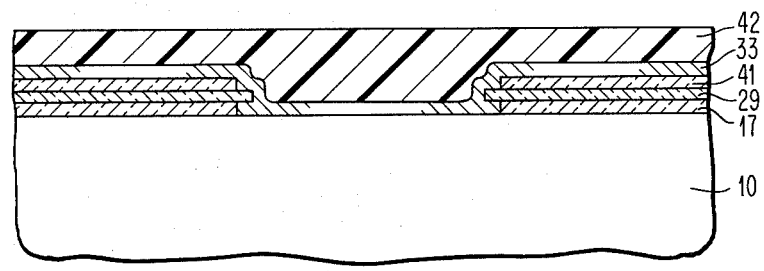

In FIG. 15 a planarizing layer of photoresist 42 is deposited.

Figure 16:
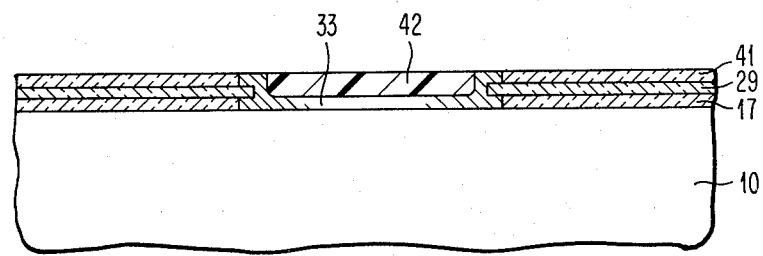

In FIG. 16 the wafer is reactive ion etched until the CVD SiO$_2$ layer 41 is reached. The reactive ion etch conditions must be adjusted to provide equal etch rates of the amorphous silicon and photoresist. Part or all of the CVD oxide 41 can be removed which gives a buffer to thickness variations. The residual photoresist 42 in the opening is removed with an O$_2$ plasma. At this point a blanket implant or an implant with a blockout mask of arsenic is performed as described above.

The remaining processing is essentially the same as described above.

While the invention has been shown and particularly described with reference to a preferred embodiment, it will be understood by those skilled in the art that various changes in form and detail may be made without departing from the spirit and scope of the invention.

We claim:

1. In a method for fabricating high speed bipolar transistors in an integrated circuit structure formed in a monolithic silicon substrate, said high speed bipolar transistors having shallow emitters, said process including the following steps:
    (a) forming an emitter window in a layer of insulating material on a planar surface of said monolithic silicon substrate;
    (b) filling said emitter window with chemically vapor deposited polysilicon;
    (c) ion implanting with arsenic ions said chemically vapor deposited polysilicon contained in said emitter window, said ion implanting energy being sufficient to render amorphous the interface of said chemically vapor deposited polysilicon and monolithic silicon;
    (d) oxidizing the exposed surface of said chemically vapor deposited polysilicon and concurrently driving in the dopant to form a shallow emitter;
    (e) removing the oxide coating from the chemically vapor deposited polysilicon;
    (f) depositing a layer of Pt on the exposed chemically vapor deposited polysilicon; and,
    (g) reacting the Pt with the chemically vapor deposited polysilicon to utilize all of the polysilicon in the formation of PtSi, whereby a very shallow emitter is formed.

* * * * *